(12) United States Patent
Wilson

(10) Patent No.: US 6,480,515 B1
(45) Date of Patent: Nov. 12, 2002

(54) OPTICALLY TRANSPARENT, HEAT CONDUCTIVE FLUID HEAT SINK

(75) Inventor: James M. Wilson, Glendora, CA (US)

(73) Assignee: Xerox Corporation, Stamford, CT (US)

(*) Notice: Subject to any disclaimer, the term of this patent is extended or adjusted under 35 U.S.C. 154(b) by 137 days.

(21) Appl. No.: 09/741,126

(22) Filed: Dec. 15, 2000

(51) Int. Cl.[7] .................................................. H01S 3/04
(52) U.S. Cl. ......................................... 372/36; 372/35
(58) Field of Search ............................. 372/36, 35, 23

(56) References Cited

U.S. PATENT DOCUMENTS

| | | | |
|---|---|---|---|
| 4,511,927 A | 4/1985 | Bauer | 358/250 |
| 5,664,864 A | 9/1997 | Kuth | 362/32 |
| 5,796,766 A | 8/1998 | Hargis et al. | 372/26 |
| 6,140,141 A | 10/2000 | Davidson | 438/16 |
| 6,330,256 B1 * | 12/2001 | Hyren et al. | 372/36 |
| 6,353,548 B2 * | 1/2002 | Roberts et al. | 373/23 |
| 6,351,478 B1 * | 2/2002 | Heberle | 372/36 |
| 2002/0004251 A1 * | 1/2002 | Roberts et al. | 438/26 |

* cited by examiner

Primary Examiner—Leon Scott, Jr.
(74) Attorney, Agent, or Firm—William Propp

(57) ABSTRACT

A fluid-filled heat sink is positioned on the emission surface of a laser diode. The light beam emitted by the laser diode aperture will propagate though the optically transparent fluid to be transmitted through an output window of the heat sink. Heat generated by the laser diode will be transferred by the thermally conductive fluid to the heat sink housing which will radiate the heat or transfer the heat to a secondary heat sink.

8 Claims, 1 Drawing Sheet

OPTICALLY TRANSPARENT, HEAT CONDUCTIVE FLUID HEAT SINK

BACKGROUND OF THE INVENTION

The present invention relates to a heat sink for conducting heat from a laser diode and, more particularly, to an optically transparent, heat conductive fluid heat sink for dissipating heat from the light emission side of the laser diode.

Laser diodes emit light from a surface of the structure. In the course of this light emission, the laser diode also generates heat. Without removing the heat from the laser diode structure, the wavelength and the power of the emitted light beam will change and the structure itself may be damaged.

Heat sinks are generally used as a means to cool laser diodes and maintain a constant temperature. A heat sink must instantaneously dissipate the heat that is rapidly produced in the laser diode structure.

A heat sink enhances heat dissipation from a hot surface of the laser diode to a cooler surrounding ambient environment, usually air. The heat sink provides a heat conduction path from the laser diode to the ambient air.

Heat transfer directly across the interface between the surface of the laser diode structure and the coolant ambient air is the least efficient means of dissipating heat and is usually unsuccessful in avoiding heat build-up within the structure of the laser diode. A heat sink lowers the surface/ambient barrier mainly by increasing the surface area that is in direct contact with the coolant ambient atmosphere. This allows more heat to be dissipated and/or lowers the laser diode operating temperature.

The thermal conductivity and cooling surface area of the heat sink must always be weighed against material and manufacturing costs of the heat sink.

Most heat sinks are made from aluminum, because of its low thermal resistance, light weight, and low cost. Copper is also used for heat sinks; although lower in thermal resistance than aluminum, its cost and greater weight make it less desirable for many applications.

Stamped heat sinks are made from a single sheet of aluminum, which is cut and bent to give the desired thermal properties and attached to the laser diode structure.

Bonded-fin heat sinks are made by bonding fins, fabricated from sheet aluminum or through aluminum extrusion, to an aluminum base attached to the laser diode structure. This process increases the surface area over a similar extruded piece, reducing the thermal resistance by ½ to ⅔.

Folded-fin assemblies are bonded-fin assemblies with complex fin shapes. By folding the fins over themselves, these assemblies provide a large surface area in a confined space.

These are all passive heat sinks where the aluminum finned heat sink radiates heat and dissipates the heat through natural convection. Natural convection occurs when there is no externally induced flow and heat transfer relies solely on the free buoyant flow of air surrounding the heat sink.

Forced convection occurs when the flow of air is induced by mechanical means, usually a fan or blower. By adding a fan to a heat sink, it changes from passive cooling, using ambient airflow, to active cooling using its own airflow source. Adding a fan to a typical heat sink almost always improves thermal performance (except in cases with very high local ambient air velocities).

For the most demanding applications, liquid cooling, in place of air cooling, further improves heat sink performance. Liquid cooling can dissipate more heat with considerably less flow volume and maintain better temperature consistency, and do it with less local acoustic noise.

However, all these various heat sinks are positioned on the non-light emitting surface of the laser diode or positioned parallel to the laser cavity of the laser diode.

It is an object of the present invention to provide a heat sink for dissipating heat from the light emission side of the laser diode.

It is a further object of this invention to provide an optically transparent, heat conductive fluid heat sink.

SUMMARY OF THE INVENTION

According to the present invention, a fluid-filled heat sink is positioned on the emission surface of a laser diode. The light beam emitted by the laser diode aperture will propagate though the optically transparent fluid to be transmitted through an output window of the heat sink. Heat generated by the laser diode will be transferred by the thermally conductive fluid to the heat sink housing which will radiate the heat or transfer the heat to a secondary heat sink.

The housing and the interior fluid-filled cavity can be cylindrical in shape which aids in the dissipation of heat and lessens the convection currents from disturbing the light beam in the optical path between the aperture and heat sink output window. The output window can be a lens to focus the light beam if the beam is dispersed by the heat convection currents in the fluid.

Other objects and attainments together with a fuller understanding of the invention will become apparent and appreciated by referring to the following description and claims taken in conjunction with the accompanying drawings.

DESCRIPTION OF THE INVENTION

Figure 1:
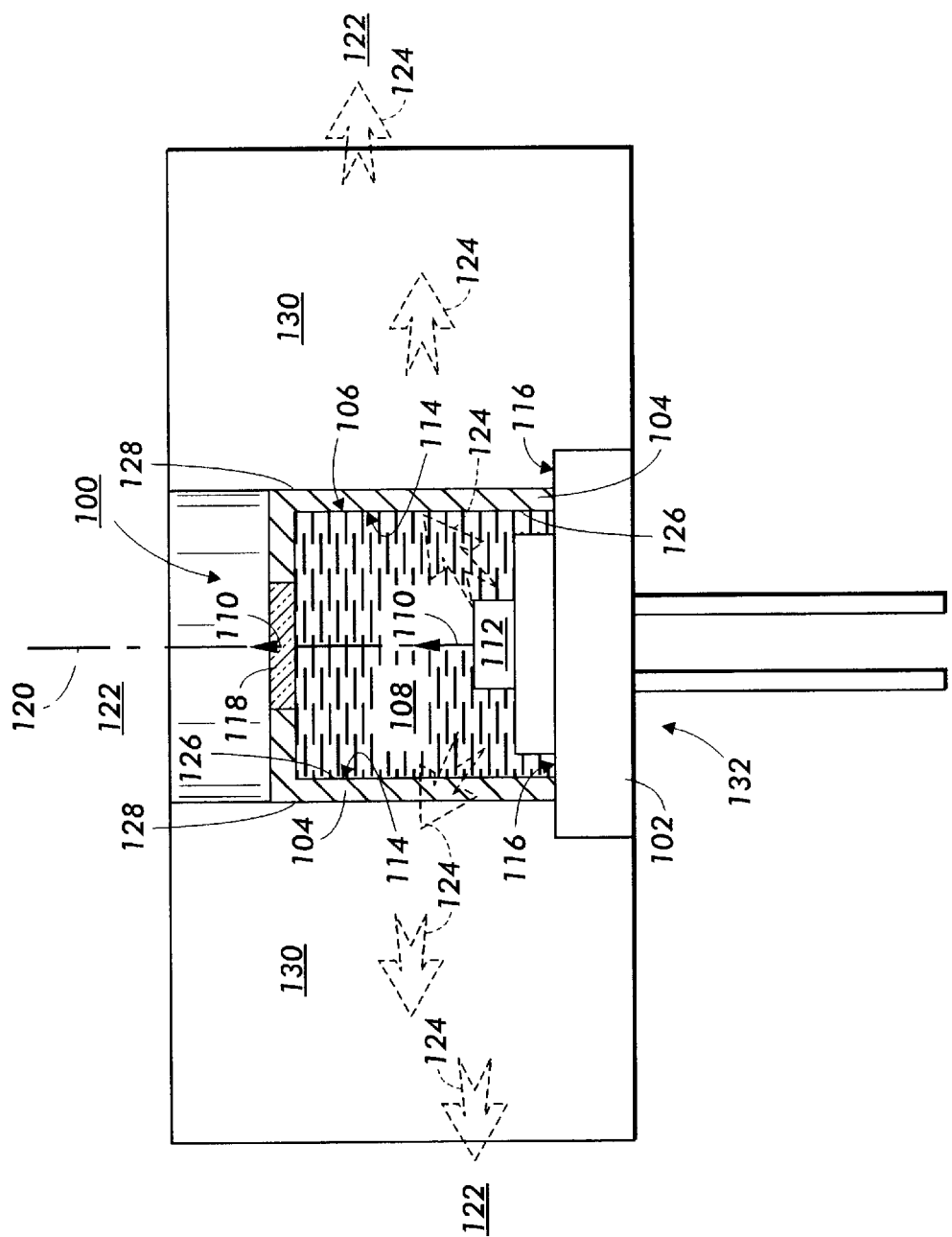
FIG. 1 is a side view of the fluid heat sink and laser diode structure of the present invention.

Reference is now made to FIG. 1, wherein there is illustrated the optically transparent, heat conductive fluid heat sink 100 for dissipating heat from a laser diode 102 in accordance with this invention.

The fluid heat sink 100 has a hollow, heat conductive housing 104 defining an interior cavity 106. The interior cavity is filled with an optically transparent, heat conductive fluid 108.

The housing 104 in this illustrative embodiment is cylindrical. The heat conductive housing is preferably metal, preferably aluminum or copper.

The laser diode 102 is a conventional laser diode for emission of a light beam 110 of a single wavelength through the laser diode aperture 112 as is known in the art.

The open circular edge 114 of the cylindrical heat sink housing 104 is attached to the emission surface 116 of the laser diode 102. The circular edge 114 and the heat sink housing 104 surround the laser diode aperture 112 with the aperture ideally being positioned in the center of the circular edge 114 and the heat sink interior cavity 106.

The heat sink 100 includes an optically transparent window 118 on the closed end 120 of the housing 104 which is opposite the open circular edge 114. The output window 118 is positioned substantially parallel to the emission surface 116 of the laser diode 102. The output window 118 is positioned opposite the laser diode aperture 112 in the heat sink 100, directly in the optical path 120 of the emitted light beam 110.

The interior cavity 106 of the heat sink 100 is filled with an optically transparent, heat conductive fluid 108. The light beam 110 will be emitted by the laser diode 102 through the aperture 112 and propagate along the optical path 120 through the optically transparent, heat sink fluid 108. The light beam 110 will then be transmitted through the heat sink output window 118 to the ambient atmosphere 122.

The fluid 108 in the fluid heat sink 100 can either be a liquid or a gas. The technical requirements are that the fluid 108 be optically transparent to the wavelength of the light beam 110 emitted by the laser diode 102 and that the fluid be heat conductive to dissipate the heat generated by the laser diode 120 during light emission away from the laser diode. Examples of such a fluid, which vary in optically transparent wavelength range and heat dissipation rate, are helium, water, deionized water, a solution of water and glycerine, perflurocarbon fluid, fluorinert, ethylene glycol, and aqueous solutions of baruium chloride, strontium chloride or barium iodide.

The optical path 120 of the light beam 110 from the aperture 112 to the output window 118 through the heat sink fluid 108 is through the center of the cylindrical heat sink housing 104.

Heat 124 generated by the laser diode 102 is emitted through the surface 116 of the laser diode 102. The fluid 108 transfers the heat to the interior wall 126 of the cylindrical heat sink housing 104. The heat 124 flows through the heat sink housing to the exterior wall 128 of the housing. The heat 124 can radiate out into the ambient atmosphere 122 or, as shown in this example, is transferred to a secondary heat sink 130 as is known in the art. The secondary heat sink can be a passive or active heat sink with or without heat radiating fins or can be a thermoelectric cooler. The secondary heat sink 130 will transfer the heat 124 to the ambient atmosphere 122.

The center positioning of the aperture within the symmetrical fluid-filled cavity and housing provides uniform radiation and uniform convection of the heat from the laser diode to the fluid heat sink.

The output window 118 of the fluid heat sink 100 must also be optically transparent to the wavelength of the light beam 110 emitted by the laser diode 102. It is not required, but it is physically and optically possible, that the output window 118 also be heat conductive to dissipate the heat generated by the laser diode during light emission away from the laser diode. Examples of materials for the output window would be quartz or BK7 glass.

The output window 118 can also be angled at Brewster's angle to reduce loss, to prevent feedback and to polarize the emitted light beam.

A conventional heat sink (not shown) can be attached to the non-emission side 132 of the laser diode to help dissipate heat from the laser diode structure 102.

Depending upon the size of the fluid molecules and their density, and the velocity of the convection currents of the fluid, the light beam 110 emitted by the laser diode 102 may be diffused as the beam propagates through the heat sink fluid 108. The output window 118 of the heat sink 100 can have optical power and be a lens to focus or collimate the diffused light beam. Alternately, other optical elements such as lenses or mirrors in the optical path of the light beam after emission from the laser diode 102 and fluid heat sink 100 can focus or collimate the diffused light beam.

The shape of the heat sink housing 104 can also lessen the dispersive effect of the convection currents of the fluid. The housing can be a hemisphere, a truncated cone with the base adjacent to the laser diode emission surface or a truncated cone with the base surrounding the output window. The exact shape will depend upon the dispersion of the emitted light beam and the convection currents of the fluid. The symmetrical shape of the fluid cavity and the housing centered around the laser diode light beam emission aperture aids in the dissipation of heat and lessens the convection currents from disturbing the light beam in the optical path between the aperture and heat sink output window.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A heat sink for conducting heat from a laser diode comprising
   a housing forming a cavity surrounding the emission aperture of said laser diode,
   an output window in said housing, said light beam emitted from said emission aperture of said laser diode being transmitted through said output window,
   a fluid in the cavity of said housing, said fluid being optically transparent to said light beam emitted from said emission aperture of said laser diode, said light beam propagating from said emission aperture to said output window through said fluid, said fluid being heat conductive to remove heat generated by said laser diode.

2. The heat sink for conducting heat from a laser of claim 1 wherein said housing is heat conductive to remove heat from said fluid.

3. The heat sink for conducting heat from a laser of claim 1 further comprising a secondary heat sink surrounding said housing to remove heat from said housing.

4. The heat sink for conducting heat from a laser of claim 1 further comprising a second heat sink on the non-emission side of said laser diode to remove heat generated by said laser diode.

5. The heat sink for conducting heat from a laser of claim 1 wherein said housing is cylindrical.

6. The heat sink for conducting heat from a laser of claim 1 wherein said housing is truncated conical.

7. The heat sink for conducting heat from a laser of claim 1 wherein said housing is hemispherical.

8. The heat sink for conducting heat from a laser of claim 1 wherein said output window is a lens for focusing said light beam.

* * * * *